United States Patent [19]

Hatzakis et al.

[11] Patent Number: 4,678,850

[45] Date of Patent: Jul. 7, 1987

[54] HALOGENATED POLYSTYRENES FOR ELECTRON BEAM, X-RAY AND PHOTO RESISTS

[75] Inventors: Michael Hatzakis, Chappaqua; John J. Liutkus, Yorktown Heights; Jurij R. Paraszcszak, Ossining, all of N.Y.; Jane M. Shaw, Ridgefield, Conn.

[73] Assignee: International Business Machines Corp., Armonk, N.Y.

[21] Appl. No.: 662,962

[22] Filed: Oct. 19, 1984

Related U.S. Application Data

[63] Continuation of Ser. No. 373,839, May 3, 1982, abandoned.

[51] Int. Cl.$^4$ .................... C08F 14/02; C08F 14/16
[52] U.S. Cl. ................................. 526/293; 526/206
[58] Field of Search .................. 526/293, 77, 206

[56] References Cited

U.S. PATENT DOCUMENTS

| | | | |
|---|---|---|---|
| 2,321,896 | 6/1943 | Britton et al. | 526/293 |
| 2,483,753 | 10/1949 | Carswell et al. | 526/293 |
| 3,489,737 | 1/1970 | Natta et al. | 526/293 |
| 3,817,957 | 6/1974 | Trepka | 526/293 |
| 4,028,486 | 6/1977 | Jalics | 526/293 |
| 4,061,799 | 12/1977 | Brewer | 427/273 |
| 4,201,580 | 5/1980 | Feit | 526/293 |
| 4,262,081 | 4/1981 | Bowden et al. | 526/293 |

OTHER PUBLICATIONS

Billmeyer, *J. Pol. Sci.*, Part C, No. 8, pp. 161-176 (1965).
Brault et al, Photopolymers Principals-Processes and Materials, SPE, Ellenville, N.Y., pp. 91-105 (1979).

*Primary Examiner*—Paul R. Michl
*Attorney, Agent, or Firm*—Scully, Scott, Murphy & Presser

[57] ABSTRACT

Poly(halogenated styrene) compositions having a molecular weight range of from about $1 \times 10^5$ to $1 \times 10^6$ and a dispersivity of from about 1.5 to about 2.5 useful as negative resists.

8 Claims, 7 Drawing Figures

FIG. 2.1
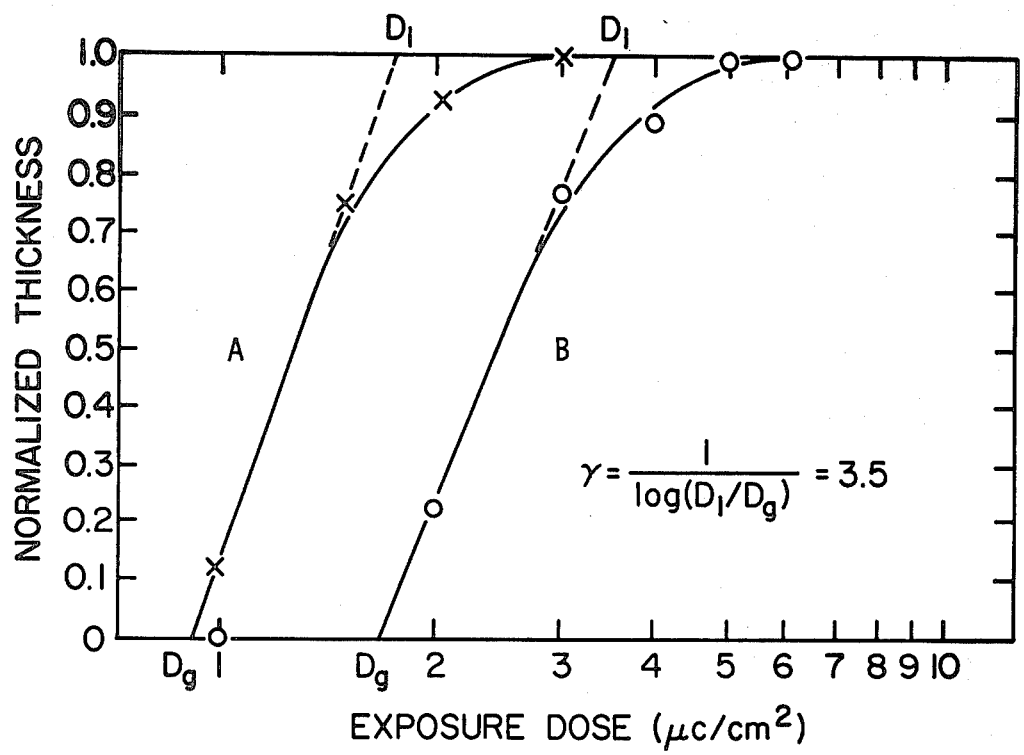
FIG. 2.2
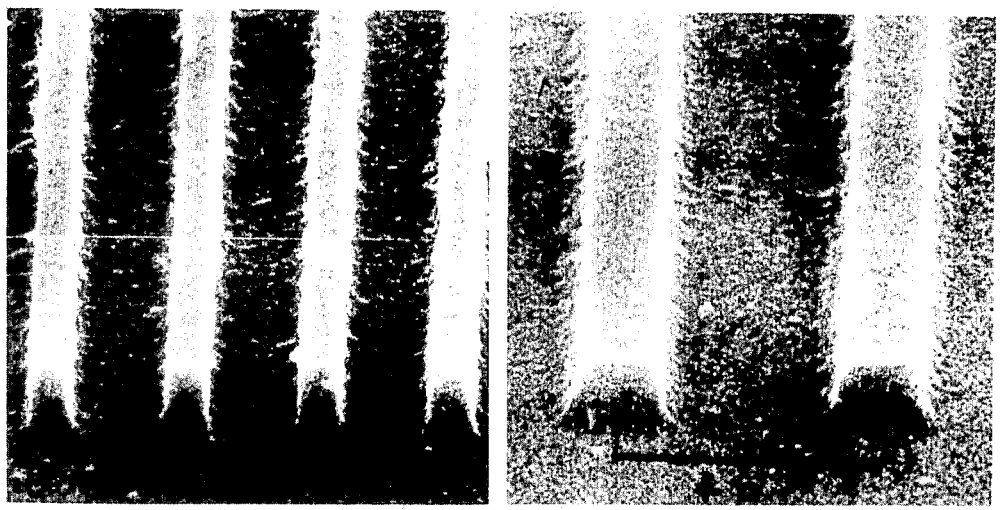

FIG. 5.1
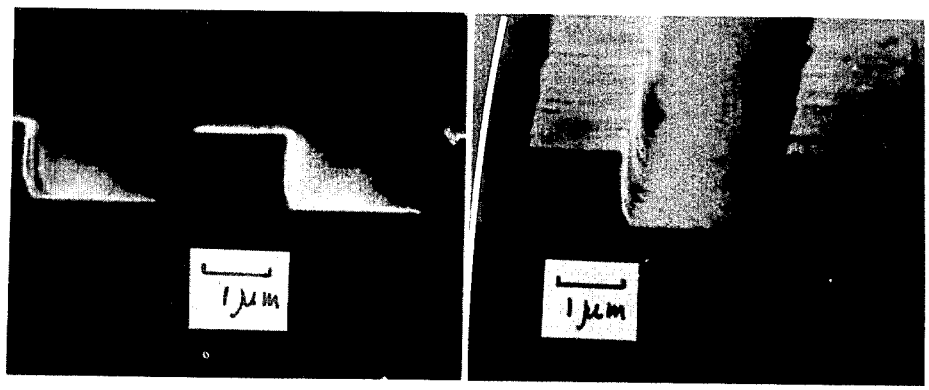
FIG. 5.2
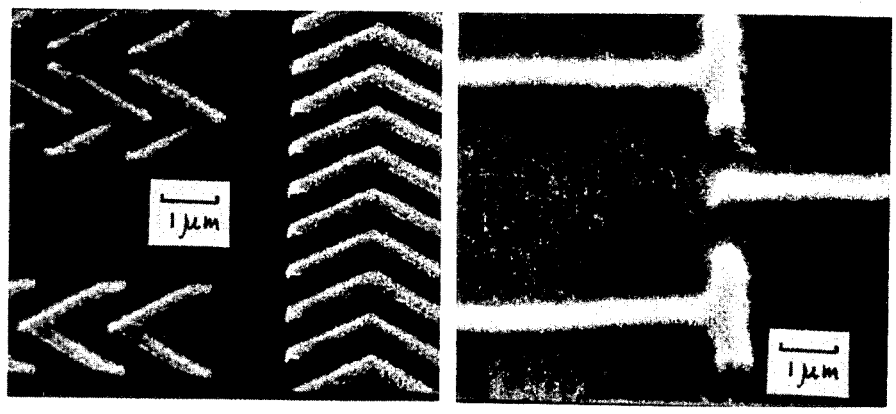

HALOGENATED POLYSTYRENES FOR ELECTRON BEAM, X-RAY AND PHOTO RESISTS

This is a continuation of copending application Ser. No. 373,839, filed on May 3, 1982, now abandoned.

BACKGROUND OF THE INVENTION

This invention relates generally to the preparation of negative electron beam resists for photomask fabrication and/or semiconductor device fabrication and more particularly to halogenated polystyrenes useful in the preparation of said negative resists.

Briefly, a resist is an adhering layer of a material with patterned openings on a substrate which is used as a mask for etching, either partially or completely through, whereby the substrate is being exposed by the openings in the resist. Generally, resists are categorized as positive or negative.

The formation of positive resist masks from layers of radiation degradable polymers is described, for example, by Haller, Hatzakis and Srinivasan in U.S. Pat. No. 3,535,137. In this process, a radiation degradable polymer layer is coated on a substrate and is subjected to patternwise exposure to high energy radiation such as, for example, x-rays, deep UV, nuclear radiation or electrons. The irradiated regions of the polymer suffer a decrease in molecular weight and thereby become more rapidly soluble. A developer is then used to preferentially remove the irradiated portions of the layer. The substrate is then subjected to an additive or substractive process such as metallization or etching with the remaining portions of the resist layer acting to protect the substrate from the processing.

Alternatively, a negative resist mask is formed by coating a cross-linkable polymer on a substrate. The polymer is generally applied as a solution in a suitable solvent to the substrate and allowed to dry as a thin film. High energy radiation, such as an electron beam, short wavelength UV light, or X-rays, is permitted to irradiate the surface of the polymer in the desired pattern to form a negative resist by imparting sufficient energy to cross-link the polymer. Cross-linking causes the irradiated portion to be insoluble in certain solvents. After irradiation is completed, the resist is subjected to a solvent and the nonirradiated portion of the resist is removed, thereby leaving openings in the resist that correspond to the desired pattern. The present invention relates to negative resists.

Prior art negative resist materials have several shortcomings, among which is the difficulty in obtaining sharp images of high resolution. Moreover, deep UV lithography using the wavelength range from 2000 to 3500 Å is receiving considerable attention as a possible economic mass production method of manufacturing ultra fine patterns (about 1 μm) for making VLSI. As these deep UV tools become available, much emphasis is being placed on finding compatible negative resist materials with high resolution, high contrast and plasma resistance.

Recently, polystyrenes have been receiving renewed attention as electron and X-ray resists, primarily since it has been shown by others that very high contrast can be obtained with high molecular weight polystyrene exposed to electron beams at doses in the range of $10^{-4}$ coul/cm$^2$ (100 μcoul/cm$^2$). It has also been shown that the sensitivity of polystyrenes can be considerably improved by physical doping with cross-linking agents and sensitizers or by incorporating such elements as chlorine, bromine or iodine in the polymer chain. In this regard, see, for example, J. C. Jagt and A. P. G. Sevriens, *Photopolymers Principles—Processes and Materials,* SPE, Ellenville, NY, p. 152 (1979); T. Tsunoda, et al., Phot. Sci. & Engr., 17(4), 390 (1973); N. A. Weir and T. H. Milkie, J. Poly. Sci. (Chem), 17, 3735 (1979); W. Burlant, et al., J. Poly Sci., 58, 491 (1962); E. D. Reit, *Photopolymers Principles—Processes and Materials,* SPE, Ellenville, NY, p. 91 (1979); and H. Shiraishi, et al., *Photopolymers Principles—Processes and Materials,* SPE, Ellenville, NY, p. 56 (1979). However, this literature illustrates that even though the sensitivity of the polystyrenes was increased in the $10^{-6}$ coul/cm$^2$ range, residues and swelling of the exposed pattern are always experienced when trying to develop a high resolution pattern in a relatively thick resist layer (~1 μm).

SUMMARY OF THE INVENTION

Accordingly, it is one object of the present invention to provide a new class of negative resist materials.

Another object of the present invention is to provide a new class of negative resist materials which are highly sensitive and plasma resistant.

Still another object of this invention is to provide a new class of negative deep UV resist materials which are highly sensitive and plasma resistant.

A still further object of the present invention is to provide a new class of negative resist materials which are highly sensitive in the deep UV region, particularly between 2000 and 2600 Å, forming high contrast negative images that are reactive ion etch (RIE) resistant.

A still further object of the present invention is to provide a new class of halogenated polystyrenes which are particularly well suited as negative resist materials.

Another object of this invention is to provide a new class of halogenated polystyrenes, useful as negative resists, which allow high contrast and resolution to be obtained on electron beam exposure leaving no residue in the unexposed region and minimum swelling of the exposed region.

Still another object of this invention is to provide a method of forming a negative resist having high resolution, high contrast and high plasma resistance.

These and other objects are accomplished herein by providing a class of poly(halogenated styrene), prepared by the solution polymerization of halo-styrene monomer, and the isolation of the polymeric fraction having a molecular weight (Mw) in the range of from about $1 \times 10^5$ to about $1 \times 10^6$ and a dispersivity (Mw/Mn) in the range of from about 1.5 to about 2.5.

BRIEF DESCRIPTION OF THE DRAWINGS

FIG. 2.1 illustrates the contrast curves for poly(4-chlorostyrene) resists of about MW 700,000 (curve A) and about MW 250,000 (curve B), useful in the present invention.

FIG. 2.2 shows scanning electron micrographs of electron beam irradiated poly(4-chlorostyrene) resists in accordance with the present invention.

FIG. 5.1 shows scanning electron micrographs illustrating the sharp line profiles obtained on deep UV exposure of poly(4-chlorostyrene) resists of the present invention.

FIG. 5.2 shows scanning electron micrographs illustrating the narrow patterns obtained on x-ray exposure of poly(4-chlorostyrene) resists of the present invention.

DETAILED DESCRIPTION OF THE INVENTION

Figure 1:
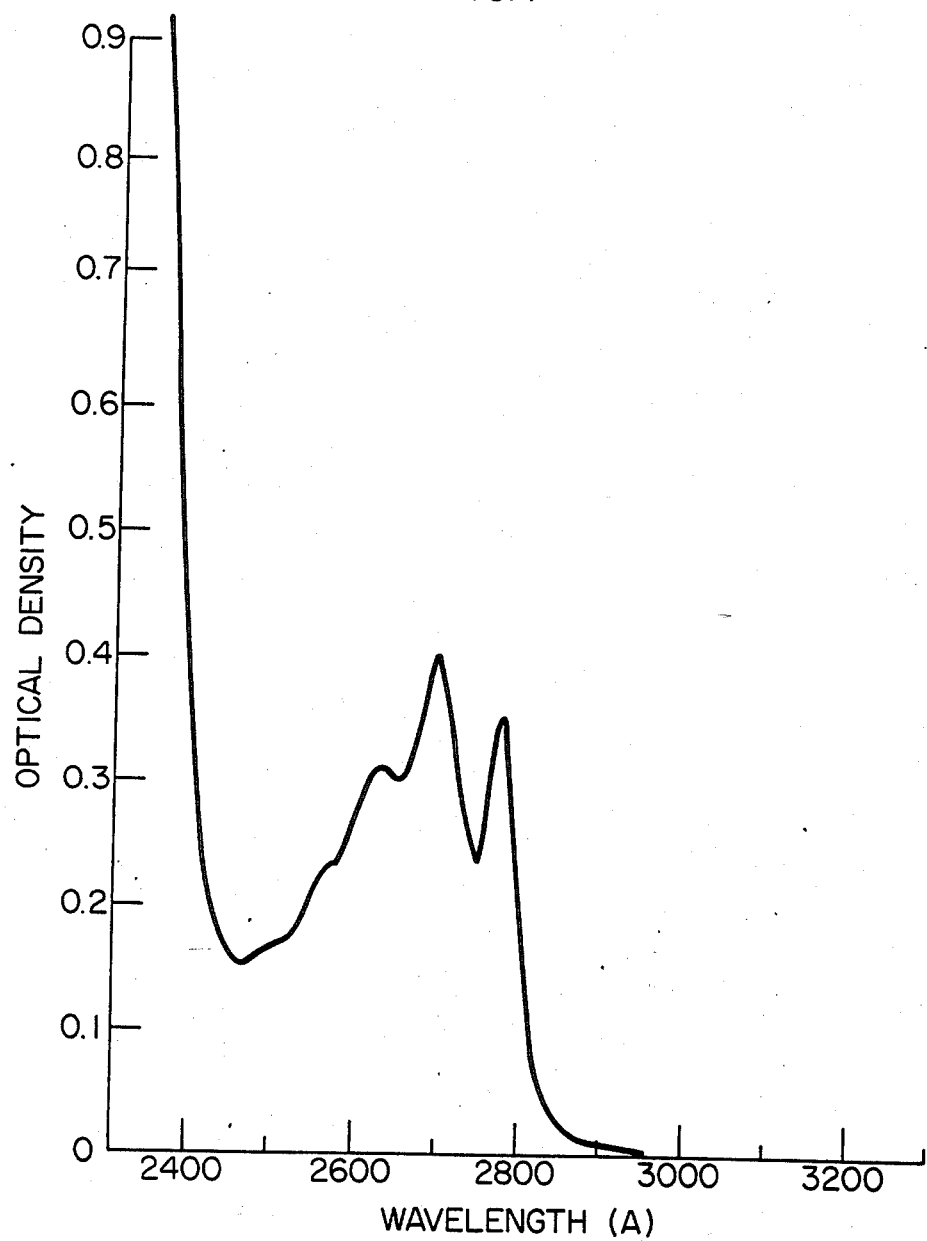
FIG. 1 is a graphical illustration of the optical absorption of a poly(4-chlorostyrene) resist (1 μm thick) of the present invention at varied wavelengths.
Figure 3:
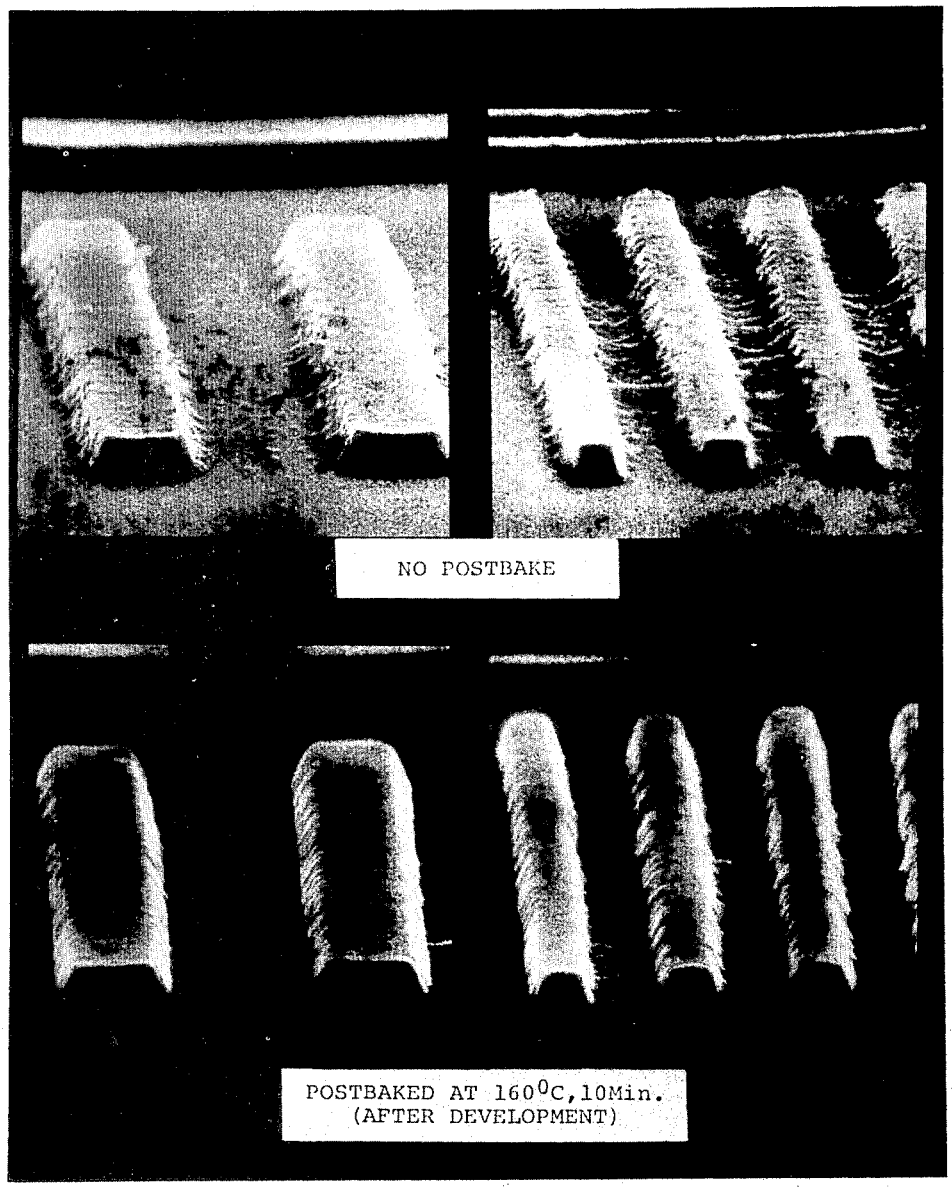
FIG. 3 shows scanning electron micrographs illustrating the thermal stability of electron beam exposed poly(4-chlorostyrene) resists of the present invention and the almost complete elimination of resist residue by postbaking.
Figure 4:
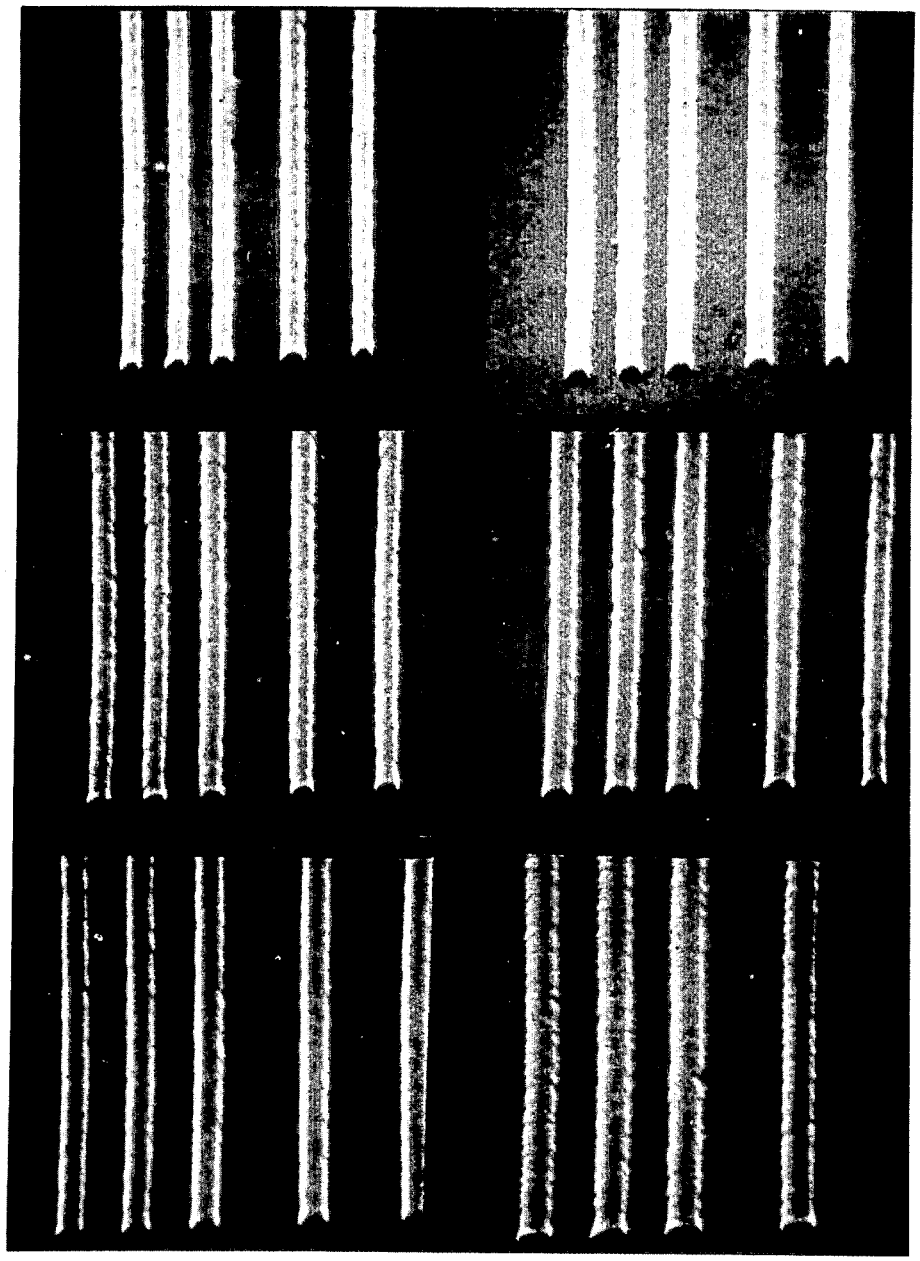
FIG. 4 is a series of scanning electron micrographs illustrating the excellent resolution obtained with electron beam exposed poly(4-chlorostyrene) resists of the present invention; minimum line=0.4 μm and minimum space=0.4 μm.

The present invention involves the use of a new class of poly(halogenated styrene), as negative electron beam, X-ray or U.V. resist materials. This new class of poly(halo-styrenes) allows high contrast and high resolution images to be obtained at electron beam exposures of, for example, $1-5 \times 10^{-6}$ coul/cm$^2$, depending on the molecular weight and molecular weight distribution of the polymer, leaving almost no residue in the unexposed region and minimum swelling of the exposed image even at thicknesses above 1 μm.

More specifically, the polymeric compositions which are employed in preparing the resists of the present invention comprise poly(halogenated styrenes) having the following general formula:

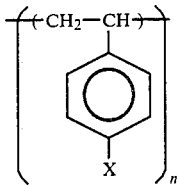

wherein n is a number in the range of from about 750 to about 7,500, X is halogen, such as Cl, Br or I, and wherein the molecular weight distribution of the polymers in the composition results in a dispersivity (Mw/Mn) of from 1.5 to 2.5. The poly(halogenated styrene) compositions of the present invention generally have a molecular weight (Mw) of from about $1 \times 10^5$ to about $1 \times 10^6$.

Representative halogenated polystyrenes included in the above formula, are, for example, poly(4-chlorostyrene), poly(4-bromostyrene) and poly(4-iodostyrene). Of these, the most preferred for the purposes of this invention is poly(4-chlorostyrene). Preferably, the polymers of the present invention have a molecular weight in the range of from about 250,000 to about 700,000 and a dispersivity in the range of from about 1.7 to about 2.2 and most preferably about 2.

In accordance with the present invention, it has been discovered that the hereinbefore-identified poly(-halogenated styrenes) must be prepared by free radical solution polymerization of the monomer in order to achieve the negative resist characteristics desired herein. In contrast to preparing the halogenated polystyrene polymers by bulk polymerization, solution polymerization is believed to result in forming less branching. Branching is deleterious since it may cause swelling of the cross-linked portions on development. Moreover, in the preparation of the poly(halostyrenes) herein, it has been found advantageous to carry out the solution polymerization at a slow rate and at a low temperature. These conditions are believed to result in less head-to-head linkages, which are weak polymer links and which would readily break down on irradiation.

More particularly, using para-chlorostyrene monomer for exemplification purposes, the preparation of the new class of negative resist polymers herein involves initially purifying the chlorostyrene monomer, e.g. by fractional distillation, to remove deleterious impurities. Since it is usually customary to add polymerization inhibitors, such as 3,5-di-tert-butyl catechol, to monomeric materials to prevent polymerization during storage, these inhibitors must be removed. Column chromatography, for example, using activated alumina, is one method which can be used for this purpose. Degassing of the monomer, to remove dissolved air/O$_2$, for example, by freeze-thawing under vacuum in liquid nitrogen has also been found advantageous since the presence of small amounts of oxygen in the monomer may result in oxygen being present in the backbone of the polymer, which also causes undesirable weak linkages in the chain.

The monomer is then ready to be slowly solution polymerized in accordance with the present invention. Specifically, the monomer is diluted with a low chain transfer coefficient solvent, such as for example, chlorobenzene fluorobenzene, perflurobenzene and the like and permitted to polymerize at, for example, a temperature of 60° C.–100° C., for a time of, for example, from about two hours to about one month. The time for polymerization is dependent upon several factors including temperature and/or the presence of a polymerization initiator. For instance, to obtain satisfactory polymer for the purposes of this invention, in the absence of an initiator and at temperatures of about 65° C., the polymerization is permitted to proceed for about one month. On the other hand, higher temperatures e.g. 100° C. and the presence of initiator, e.g. azo compounds, such as 1,1'-bis azoisobutyronitrile, the polymerization may be terminated in about two hours.

Other initiators, which may be utilized in the solution polymerization contemplated herein, include, for example, organic peroxides, such as benzoyl peroxide, tert-butyl-hydroperoxide, hydrogen peroxide, and peracetic acid. Generally, if used, the initiator is employed at levels of from about 0.05 to about 0.20 mole %.

After the polymerization reaction is terminated, the reaction solution is fractionated, via differential solubility of molecular weights in various solvent mixtures, to remove undesired low molecular weight polymer and to isolate the polymeric fraction having a molecular weight of from about $1 \times 10^5$ to $1 \times 10^6$ and a dispersivity of from about 1.5 to about 2.5. Solvents useful for fractionation of this sort include, for example, methyl ethyl ketone and methanol.

In forming the negative resist, the halogenated polystyrene is generally applied as a solution, such as, for example, in cyclohexanone, to a substrate, such as, for example, a silicon wafer and spin coated. To obtain the desired thickness on the support, the spin coating is usually carried out at from about 1,000 RPM to about 10,000 RPM. The coated substrate is prebaked for example at 160° C.±5° for about 15 minutes. Then an electron beam or other source of irradiation is caused to sweep or flood the surface of the polymer on the substrate in the desired pattern to form a negative resist by imparting sufficient energy to cross-link the polymer, thereby making the irradiated portions insoluble in certain solvents. Exposure dosages for the purposes of this invention are generally in the range of from about 1 to about 5 μc/cm² with electron beams, depending on the molecular weight and MWD of the polymer. With ultraviolet light (UV), the dosage is in the range of about 20–60 mJ/cm² at wavelengths from 200–260 nm. Also, with x-ray irradiation at 8–12 angstroms wavelength, a dose of 20–60 mJ/cm² is required.

After the electron beam, UV or X-ray exposure is completed, the resist is subjected to a solvent, such as methylisobutyl ketone, 2-ethoxyethanol and the like and mixtures thereof and the non-irradiated portion of the resist is removed, thereby leaving openings in the resist that correspond to the desired pattern. If this pattern is to be RIE etched, the resist shows superior resistance due to the fact that it etches at 50% of the rate of PMMA in $CF_4$, $H_2$, $O_2$, and $CF_4/10\%$ $H_2$ RIE plasmas.

In order that those skilled in the art may better understand how to practice the present invention, the following examples are given by way of illustration and not by way of limitation.

EXAMPLE 1

Inhibitor (3,5-di-tert-butyl-cathecol) is removed from 4-chlorostyrene by adsorption on an activated alumina column. To a round bottom flask is added 192 ml of monomer and 350 ml of chlorobenzene (about ½ molar) and 0.22 g of benzoyl peroxide (0.1 wt%). The solution is degassed by bubbling $N_2$ with stirring for two days. The flask is then heated to 65° C. (±0.5°) with stirring, under $N_2$ for 6 days (144 hrs). After precipitation, polymer yield is 140 g (~60%), Mn=115,000, Mw=430,000, D=3.75.

Fractionation is effected as follows: Add 100 g of the poly-4-chlorostyrene to 1000 ml methyl ethyl ketone. After dissolution, add dropwise (w/vigorous stirring) 250 ml methanol. Stir for 2 hours after addition. Separate and precipitate the resultant two layers.
Low fraction: Mn=46,000, Mw=102,000, D=2.2
High fraction: Mn=138,000, Mw=275,000, D=2.0.
The high fraction is especially useful as a negative resist in accordance with the present invention.

EXAMPLE 2

Procedure is similar to Example 1 with the following variations. The flask contains 110 ml of 4-chlorostyrene, 200 ml chlorobenzene, and no initiator. The temperature and degas conditions are the same. Time for polymerization is 26 days. Polymer yield is 80 g (~65%), Mn=208,000, Mw=500,000, D=2.4.

Two fractionations are performed (as per Example 1) the highest fraction is saved. Poly-4-chlorostyrene is maintained as a 10% solution in MEK, with the following MeOH/MEK ratios: fraction #1=0.25; fraction #2=0.22. The highest fraction (#2), Mn=390,000K, Mw=680,000K, D=1.75 is especially useful as a negative resist in accordance with the present invention.

EXAMPLE 3

Preparation of Negative E-beam (UV/X-Ray Resist)

Poly (4-chlorostyrene), (high fraction), prepared in accordance with Example 1, is dissolved in cyclohexanone to produce an 11% solution. A silicon wafer (treated with a drop of hexamethyldichlorosilane) is spin coated (at about 5000 RPM) with the 11% polymer solution to obtain about 7000 Å thick film after bake. The coated silicon support is prebaked at 160° C.±5° C. for 15 minutes and exposed to an electron beam at a base dose of 5 μcoul/cm². The resist is developed by dipping the irradiated coated support in a solution of 4 parts methylisobutyl ketone (MIBK) to 3 parts 2-ethoxyethanol for at least 3 minutes, then dipping in 2-ethoxyethanol, without allowing to dry for 30 seconds and then spraying with 2-ethoxyethanol for 5 seconds. The so treated wafer is then blow dried with nitrogen gas, and the resist pattern is ready for further processing. If hardening is desired, the wafer is exposed to a deep UV source (low pressure mercury lamp), prior to the next processing step, for 3–5 minutes and is postbaked at 160°–200° C.

Obviously, other modifications and variations of the present invention are possible in light of the above teachings. It is therefore, to be understood that changes may be made in the particular embodiments of this invention which are within the full intended scope of the invention as defined by the appended claims.

We claim:

1. A polymer useful in forming a negative lithographic resist mask, said polymer having the general formula

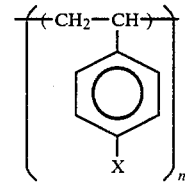

wherein X is chlorine, bromine or iodine, n represents a number in the range of from about 750 to about 7,500, wherein the molecular weight (Mw) of the polymer is in the range of from about $1 \times 10^5$ to about $1 \times 10^6$, the dispersivity (Mw/Mn) of the polymer is in the range of from about 1.5 to about 2.5 and the contrast is about 3.5.

2. The polymer according to claim 1 wherein X is chlorine, Mw is about 250,000–700,000 and said dispersivity is about 1.7 to about 2.2.

3. A polymer useful in forming a negative resist mask, said polymer prepared by polymerizing a halostyrene monomer selected from the group consisting of p-chlorostyrene, p-bromostyrene and p-isodostyrene in a low chain transfer coefficient solvent at a temperature in the range of from about 60° C. to about 100° C. for a time of from about 2 hours to about 1 month and subsequently isolating the polymeric fraction having a molecular weight (Mw) in the range of from about $1 \times 10^5$ to $1 \times 10^6$, a dispersivity (Mw/Mn) in the range of from about 1.5 to about 2.5 and a contrast of about 3.5.

4. The polymer defined in claim 3 wherein said halostyrene monomer is 4-chlorostyrene.

5. A polymer according to claim 3 wherein said halostyrene monomer is degassed prior to polymerization.

6. The polymer of claim 3 wherein said low chain transfer coefficient solvent is selected from the group consisting of chlorobenzene, fluorobenzene and perfluorobenzene.

7. The polymer of claim 1 comprising poly(4-chlorostyrene).

8. The polymer of claim 3 comprising poly(4-chlorostyrene).

* * * * *

UNITED STATES PATENT AND TRADEMARK OFFICE
CERTIFICATE OF CORRECTION

PATENT NO. : 4,678,850
DATED : July 7, 1987
INVENTOR(S) : Hatzakis, et al

It is certified that error appears in the above-identified patent and that said Letters Patent is hereby corrected as shown below:

Column 6, line 46, Claim 3: "p-isodostyrene" should read -- p-iodostyrene --.

Signed and Sealed this

Second Day of February, 1988

Attest:

DONALD J. QUIGG

Attesting Officer

Commissioner of Patents and Trademarks